United States Patent [19]

Colineau

[11] 4,425,076
[45] Jan. 10, 1984

[54] PROCESS AND APPARATUS FOR AUTOMATIC POSITIONING OF A SUBSTRATE ON A WORKTABLE

[75] Inventor: Robert C. Colineau, Angers, France

[73] Assignee: Compagne Internationale pour l'Informatique Cii Honeywell Bull (Societe Anonyme), France

[21] Appl. No.: 331,283

[22] Filed: Dec. 16, 1981

[30] Foreign Application Priority Data

Dec. 24, 1980 [FR] France .................. 80 27417

[51] Int. Cl.³ .................................... B65H 9/10
[52] U.S. Cl. ............................ 414/781; 269/153;
269/227; 269/237; 269/303; 271/236; 24/740;
33/180 R
[58] Field of Search ............ 414/754, 781, 757;
271/233, 234, 236, 238, 239; 269/227, 24, 152,
153, 237, 303; 33/180 R, 184.5; 29/559, 740;
198/394

[56] References Cited

U.S. PATENT DOCUMENTS

| 3,466,514 | 9/1969 | Brunner et al. | 414/754 X |
| 3,908,980 | 9/1975 | Fowler | 271/236 X |
| 4,186,916 | 2/1980 | Varga | 269/303 |
| 4,226,569 | 10/1980 | Gerard et al. | 414/754 X |
| 4,255,077 | 3/1981 | Smith | 29/740 X |
| 4,327,786 | 5/1982 | Markkula | 269/303 X |

FOREIGN PATENT DOCUMENTS 132528 8/1973 United Kingdom ............... 271/236

Primary Examiner—Robert J. Spar
Assistant Examiner—Ken Muncy
Attorney, Agent, or Firm—Kerkam, Stowell, Kondracki & Clarke

[57] ABSTRACT

A process and an apparatus for automatically positioning a piece on a worktable. A worktable (4) supports a reference system (3) constituted by three rollers (G1, G2, G3). The piece such as a substrate (2) is placed on the table (4) in the neighborhood of the rollers. A first pivoting arm (21) comes into contact with a side (C3) of the substrate (2) to bring the opposed side (C1) in contact with the rollers (G1, G2). A second pivoting arm (20) comes into contact with the side (C4) of the substrate (2) to bring the opposed side (C2) in contact with the roller (G3). The arms (20, 21) are controlled by a single means such as a jack (22) of which the body (23) and the rod (24) are floatingly mounted and are respectively associated with the two arms (20, 21). The invention is primarily useful for positioning of a support for integrated circuits in a serigraphic machine.

4 Claims, 6 Drawing Figures

PROCESS AND APPARATUS FOR AUTOMATIC POSITIONING OF A SUBSTRATE ON A WORKTABLE

BACKGROUND OF THE INVENTION

1. Field of the Invention

The present invention relates generally to a process and apparatus for automatic positioning of a piece, such as a support for electronic components on a worktable where the support must be precisely positioned in a determined position with respect to a reference system carried by the table, the invention relates more particularly to a serigraphic machine for automatic positioning of a substrate on a worktable of the machine for the manufacture of connection circuits formed by multiple thick layers deposited on the substrate before mounting and connecting electronic components between the layers by connecting circuits.

2. Description of the Prior Art

In a general way, industrial products in numerous applications require tools which are very precise and assembly processes for mounting components wherein a minimum of play exists between the pieces used in the process. In all these cases, the precision of manufacture or of mounting is equally conditioned by the precision of the positioning of pieces, one with respect to the others, and more generally by the position of pieces to be worked vis-a-vis on a support or worktable utilized during the course of manufacture or the course of mounting.

In the electronic industry primarily and with the object of realizing circuits still more perfect and for assembling them in ever reducing volumes, the manufacturers have been led to utilize microplates of integrated circuits more commonly referred to as microchips or "chips" and to mount these chips on substrates of which the conductors or conductive layers are distributed in several separate planes, insulated one from the others, by insulating layers except at certain predetermined points where conductive columns assure the electric connections between conductors or conductive layers situated in different planes.

Fabrication of these substrates is generally done using a serigraphic machine which permits depositing on an insulating electric support, for example, alumina, a series of layers alternately conductive and insulating, each layer being obtained by application to a screen on which the transparent portions correspond to that of the layer to be obtained, of a pasty material which is either conductive or insulating.

To be able to obtain electric connections between conductors situated in different planes, it is indispensable that the screens which are mounted successively in the serigraphic machine to depose these layers be positioned with very great precision, one with respect to the others. It is equally important that the support in the serigraphic machine which is used each time to receive a layer should be perfectly positioned with respect to the screen.

In U.S. Pat. No. 4,236,301, there is described means for positioning a substrate on a movable worktable comprising a horizontal support plateau of a substrate. These means include a reference system of three points constituted by three rollers fixed in position for rotation around vertical axes. This cartesian reference system has a first axis defined by two rollers, while the second axis perpendicular to the first axis passes by the third roller. This second axis places the first axis outside of the portion of the axis comprised between the two rollers defining the first axis.

To position the substrate with respect to this reference system, that is to apply two lateral adjacent sides of the substrate against these three rollers (two rollers for a side and the third roller for the other lateral side), three supplementary rollers or pressure rollers are provided capable of free pivoting around a vertical axis for displacement in an opening of a support plateau to maintain the substrate against the three rollers of the reference system. In other words, the substrate is positioned on the support plateau against the three rollers of the reference system, and through the use of a manual control system, three pressure rollers are moved to maintain the substate in contact with the three rollers of the reference system.

SUMMARY OF THE INVENTION

In order to automate the positioning of such a substrate on a worktable and more generally of a piece such as a support for electronic components, the invention provides a process and automatic positioning apparatus to contribute to the automation of the fabrication and/or of mounting of pieces forming an industrial product.

To this end, the invention proposes a process of automatic positioning of a piece such as a support for electronic components on a worktable with respect to a reference system defined on this table by three fixed stops. A first axis (X'X) of the reference system passes through two of the three stops, while a second axis (Y'Y) of the reference system, perpendicular to the first axis, passes through the third stop and cuts the first axis at a point O outside of the part of the first axis situated between the two first stops. The support has the general form of a rectangular parallelopiped having four lateral sides. The support is positioned on the worktable in the quadrant (X O Y) of the reference system, the half-axis (O X) passing through the first two stops and the half-axis (O Y) passing through the third stop. The displacement of a first pivoting arm which comes in contact with the support is controlled and displaced and a lateral side of this support is brought into bearing against the two first stops of the reference system. This first arm comes in contact with the lateral side of the support opposed to that in contact with the two first stops; the displacement of a second pivoting arm which comes in contact with the support is controlled so as to displace it in a movement of translation parallel to the axis (X' O X) and bring the lateral side of the support adjacent to the third stop of the reference system into bearing against this third stop. The second arm comes in contact with the lateral side of the support opposite to that coming in contact with the third stop of the reference system. Finally, the support is maintained against the stops of the reference system during an operation for mounting electronic components on the support.

In accordance with an important advantage of the process of the invention, the support is automatically positioned with respect to the three stops of the reference system. This positioning is carried out during two periods. In a first period the two stops define a first axis of the reference system, and in a second period the third stop defines the second axis of the reference system.

Another object of the invention is to provide a device or apparatus for carrying out the process conforming to the invention. This device is characterized in that two positioning arms extend in horizontal planes and are respectively connected toward an extremity on two vertical coaxial axles supported in rotation by the worktable of the machine and controlled in rotation, in opposite directions one to the other, by single motor means comprising, for example, two pieces movable in two opposed directions or inverse directions and respectively on the two axes of entrainment of the two positioning arms.

In accordance with another feature of the device conforming to the invention, the single motor means is constituted by a screw of which the body and the piston rod are mounted floatingly, with the body of the jack connected to a first movable toothed rack which engages a first pinion fixed solidly for rotation on the driving axis of one of the positioning arms, and with the piston rod connected to a second movable toothed rack parallel to the first rack which engages a second pinion fixed solidly for rotation in the axis of entrainment of the other positioning arm.

With such a motor means, when the jack is under pressure, the body of the jack and the rod of the jack move in two opposed directions, the two racks moving in two different directions or rotation, the two pinions connected with the two positioning arms, thus causing the pivoting of these two arms in two opposed directions bringing them respectively into contact with the two lateral adjacent sides of the support which are not designed to come into contact with the stops of the reference system.

To be able to carry out the positioning in two periods of the support with respect to the reference system, it is necessary that the arm affecting the position of the support against the two first stops of the reference system act before the arm carrying out the positioning of the support against the third stop of the reference system.

Also, in accordance with another feature of the device conforming to the invention, the displacement of the rack which drives the pivoting of the positoning arm associated with the third stop of the reference system is braked, by a leaf brake, for example, to favor the displacement of the other rack, this leaf brake acting to delay pivoting of the arm assuring the position of the support against the third stop of the reference system.

The important advantage of such a control system is that it is unique, that it simplifies moreover the structure of the positioning device conforming to the invention, while assuring precise positioning of the support.

BRIEF DESCRIPTION OF THE DRAWINGS

Other advantages, characteristics and details will appear from the description which follows made with reference to the drawings which accompany the application in which.

DESCRIPTION OF THE PREFERRED EMBODIMENTS

Figure 2:
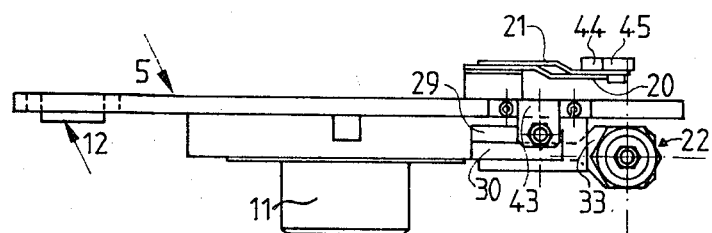
FIG. 2 is a view taken along arrow II of FIG. 1 and limited solely to the face of the worktable.
Figure 1:
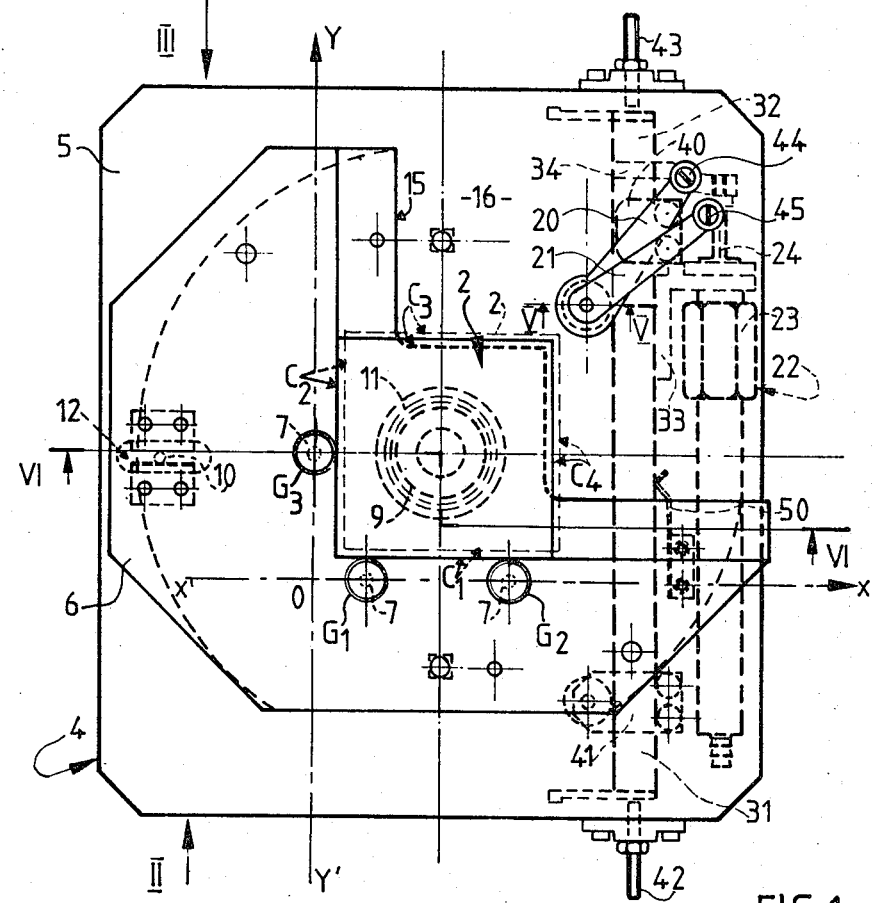
FIG. 1 is a view from above of a positioning device conforming to the invention mounted on a worktable comprising a bed on which a plate is mounted carrying the reference system.
Figure 3:
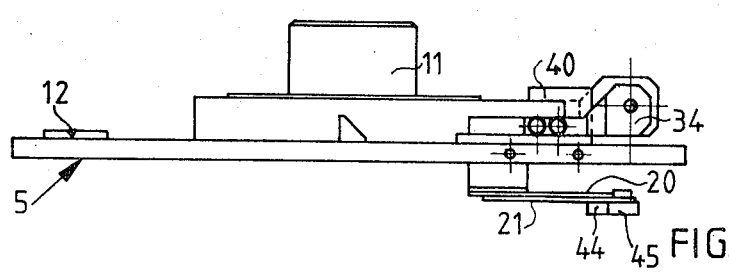
FIG. 3 is a view taken along arrow III of FIG. 1 and limited to the bed of the worktable.

With reference to FIGS. 1 to 3, the positioning device (1) conforming to the invention shown by way of example serves to position a piece (2) such as an electronic component support, referred to hereafter as a substrate, with respect to a reference system (3) of a worktable (4).

Worktable 4 is composed of two parts that is a base (5) which supports the positioning device 1, and a plate (6) which supports the reference system 3. Plate 6 is supported on base 5.

Figure 6:
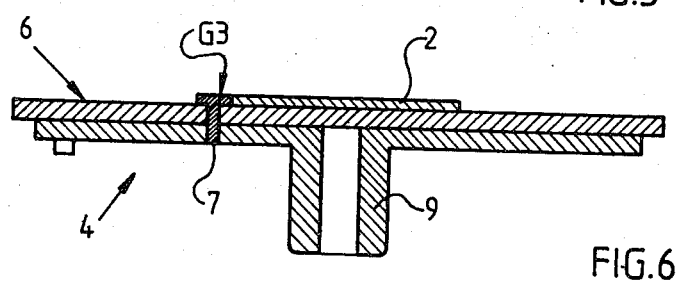
FIG. 6 is a sectional view on line VI—VI of FIG. 1 limited to the plate for the worktable comprising the reference system.

Referring to FIGS. 1 and 6, the reference system 3 is formed by three stops, fixed and advantageously constituted, by way of example, by three rollers (G1, G2, G3) each rotatively mounted around a fixed vertical axis (7) and supported by plate 6 of the worktable 4.

These three rollers G1, G2, G3 define two axes, a first axis (X'X) passing through two rollers G1 and G2, and a second axis (Y'Y) perpendicular to axis X'X and passing through the third roller G3. It is to be noted that the second axis Y'Y cuts the first axis X'X at a point O situated outside of the part of the axis X'X situated between the two rollers G2 and G2.

Plate 6 has a lower surface opposed to that to which the rollers G1, G2 and G3 are mounted, a central cylindrical boss (9) and a positioning pin (10). This plate 6 is supported on an upper flat horizontal surface of base 5 (FIG. 1), by positioning the cylindrical boss 9 of plate 6 in a central opening in base 5. This central opening is extended by an annular boss (11) within which is mounted boss 9 of plate 6. To assure correct positioning of plate 6 with respect to base 5, reference pin 10 cooperates with positioning device (12) having an opening in which the reference pin 10 projects.

With reference again to FIG. 1 it is to be noted that plate 6 has an offset edge (15) in such a way as to leave free a zone (16) of the upper surface of base 5 not covered by plate 6.

A positioning device 1 conforming to the invention is essentially constituted by two positioning arms or levers (20, 21) situated in horizontal parallel planes and able to pivot in two opposed directions under the control of single motor means constituted, for example, by a jack (22), the body (23) of which and the piston rod (24) are floatingly mounted.

Figure 4:
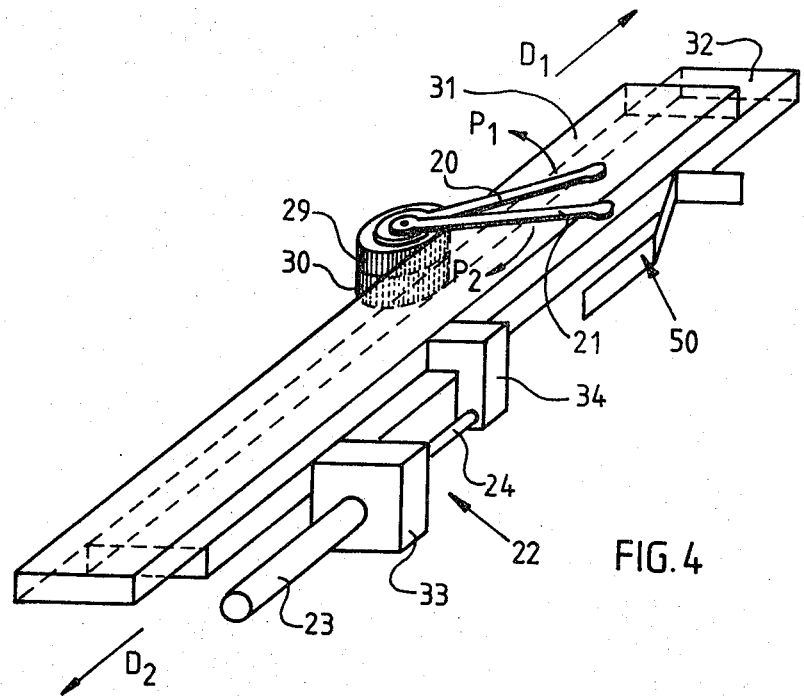
FIG. 4 is a schematic perspective view illustrating the functioning principle of the positioning device conforming to the invention.
Figure 5:
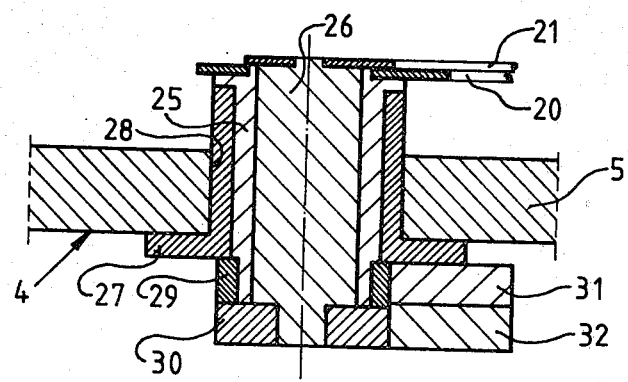
FIG. 5 is an enlarged sectional view on line V—V of FIG. 1.

The nature of the connections between the two positioning arms 20, 21 and jack 22 is illustrated schematically in FIGS. 4 and 5.

The two arms 20, 21 are connected respectively, toward an end, with the two extremities of two vertical coaxial axes (25, 26) supported in rotation by base 5 of worktable 4. These two axes are mounted within the same bearing (27) self-mounted in an opening (28) provided in base 5 of worktable 4. Axis 25 is an annular axis in which is rotatively mounted axis 26 or central axis. The two other free extremities of these two arms 20, 21, which are extended below the lower surface of base 5, are respectively connected for rotation with two fixed coaxial pinions (29, 30), mounted one beneath the other. The pinion 29 associated with axis 25 is situated at a higher level than pinion 30 associated with axis 26. These two pinions 29, 30 respectively engage two racks (31, 32) with horizontal axis each being movable in translation around its axis.

Jack 22 is mounted parallel to racks 31, 32, with its body 23 connected to rack 32 and its piston rod 24 connected to rack 31, these connections being shown at 33 and 34.

In these conditions, when jack 22 is under pressure, piston rod 24 and its body 23 displace respectively in two opposed directions (D1, D2) and cause respectively the movement of the racks 31, 32 along these two same opposed directions D1 and D2. The two racks 31, 32 consequently drive in rotation the pinions 29 and 30 in two inverse directions of rotation one from the other which results in pivoting of the arms 20, 21 in two inverse directions one from the other (P1, P2), respectively.

The principal of a positioning device conforming to the invention illustrated in FIGS. 4 and 5 is found in the embodiment of the invention as shown in FIGS. 1 to 3.

The two positioning arms 20, 21 are disposed horizontally at the level of the upper surface of plate 5 of worktable 4 and in part 16 of this plate which is not covered by plate 6 supporting the system of reference G1, G2, G3. The drive mechanism for these two arms 20, 21 is located at the level of the lower surface of the base 5 of worktable 4. More precisely, jack 22 is mounted parallel to the axis Y' O Y of the reference system 3, as are the two racks 31, 32.

It is to be noted that the two racks 31, 32 are constituted by two longitudinal planes drivingly mounted one on the other and supported by two caps (40, 41) at opposed ends connected to base 5. Two longitudinal sides of these two plates each have a toothed sector which engages the associated pinion. In effect, given the extent of displacement of these two racks, it is not necessary that the toothed sectors extend the entire length of the plates. The two racks 31, 32 are respectively associated with two fixed stops (42, 43) against which they come to rest respectively and are stopped while the arms are in the initial position, as shown in FIG. 1, that is to say, before the positioning of the substrate 2.

The process for automatic positioning of the substrate 2 on worktable 4 will now be described with respect to reference system 3 constituted by the three rollers G1, G2 and G3 carried by plate 6 which in turn is carried by base 5 of the worktable.

In a first step, the substrate 2 is disposed manually or automatically on plate 6 in the quadrant X O Y of reference system 3. The substrate 2 is approximately positioned with respect to reference system 3 with the lateral side C1 of substrate 2 adjacent the rollers G1 and G2 and an adjacent lateral side C2 adjacent roller G3. Substrate 2 is represented in broken line form in FIG. 1.

In a second step, the positioning arms 20, 21 place the substrate 2 in two steps against the rollers G1, G2 and G3, thus assuring precise positioning of substrate 2 with respect to reference system 3. As has been described with respect to the description of FIGS. 4 and 5, applying pressure to jack 22 causes the pivoting of the two arms 20, 21 in the direction P1 and P2, respectively.

In a first period, the arm 20, by its free end which advantageously supports a roller (44) mounted for rotation in a horizontal plane, comes in contact with lateral side C3 of substrate 2, to displace substrate 2 and place its lateral side C1, opposite lateral side C3, against the two rollers C1 and C2 situated on axis X' O X of the reference system 3.

In a second period of time, the free extremity of arm 21 which also supports a roller (45) mounted for free rotation in a horizontal plane, comes in contact with lateral side C4 of substrate 2. Arm 21 moves substrate 2 in a direction of displacement parallel to the axis X' O X of reference system 3 to bring its lateral side C2, opposite to lateral side C4, to bear against rollers G3 situated on axis Y' O Y of the reference system 3. During this displacement, the lateral side C1 of substrate 2 remains in contact with rollers G1, G2 entrained in rotation by the displacement of substrate 2.

In accordance with the invention, it is necessary then that positioning arm 21 act with a slight delay with respect to positioning arm 20. Inasmuch as these two arms are pivoted by a single control member, this delay is provided at the level of the transmission of movement between jack 22 and the arms 20, 21. In accordance with the invention, the movement of rack 31 is favored with respect to the rack 32, thanks to a plate brake (50) (shown in FIGS. 1 and 4) which bears against rack 32 associated with arm 21 and against a portion situated outside of the toothed sector carried by this rack. In these conditions, when jack 22 is put under pressure, plate or leaf brake 50 poses a resistance to the displacement of rack 32, thus favoring the displacement of rack 31. Thus, arm 20 will pivot first in advance of arm 21.

Jack 22 is advantageously a double action jack to assure return to initial position of the two positioning arms 20, 21 turning the two racks 21, 32 respectively into contact with the stops 41, 43.

In the example illustrated, the control member 22 of the two arms 20, 21 is constituted by a jack, but other control means could be utilized with the condition that they possess or that they drive directly or indirectly two movable elements in two opposed directions, these elements being respectively associated with the two positioning arms. In a variation, it is possible that the two entrainment axes 25, 26 of the two arms 20, 21 will not be coaxial but simply parallel to each other.

Such a positioning device can include and be included in an automatic work cycle, notably for the manufacture of supports for connection circuits with fixed layers utilizing a serigraphic machine where the device conforms to the invention services to position with precision the supports on the worktable of the serigraphic machine.

I claim:

1. Apparatus for automatically positioning a piece such as a support (2) for electronic components comprising a worktable (4), a reference system (3) defined on the table by three fixed stops (G1, G2, G3), said reference system including a first axis (X'X) of the reference system passing through two of the three stops, and a second axis (Y'Y) perpendicular to the first axis and passing through the third stop (G3) and cutting the first axis at a point O outside of the part of the first axis situated between the two first stops (G1, G2); the support (2) having the general form of a rectangular parallelopiped presenting four lateral sides (C1, C2, C3, C4), means for positioning the support (2) on the worktable (4) in the quadrant (X O Y) of the reference system (3) with the half-axis (O X) passing through the two first stops (G1, G2) and the half axis (O Y) passing through the third stop (G3), two arms (20, 21) extending in horizontal planes and respectively connected at one extremity with two vertical axes (25, 26) driven in rotation and in opposite directions with one respect to the other, and a single motor means (22) for driving said arms (20, 21), said single motor means (22) comprising at least two elements (31 and 32) movable in two opposite directions and respectively associated with the said two axes (25, 26), a jack (22) having a body (23) and piston rod (24) floatingly mounted, the rod (24) of the jack (22) being connected to a first movable rack (31) arranged to engage a first pinion (29) for rotation of the driving axis (25) of one of the positioning arms (20) and the body of the piston (23) being connected to a second movable rack (32) parallel to the first rack (31) and which engages a second pinion (30) fixed for rotation of the driving axis of the other positioning arm (21), the two driving axes (25, 26) being coaxial, first means for controlling the displacement of the first arm (20) so as to cause the first arm to contact the support (2) and position the lateral side (C1) of the support (2) against the first stops (G1, G2) of the reference system (3), the first arm (20) contacting the lateral side (C3) of the support opposed to that side in contact with the two first stops (G1, G2), second means for controlling the displacement of the second arm (21) so as to cause the second arm to contact the support (2) and position it in a movement of translation parallel to the axis (X' O X) and bring the lateral side (C2) of support (2) adjacent the third stop (G3) of the reference system (3) and causing it to bear against the third stop, this second arm (21) contacting the lateral side (C4) of the support opposed to that coming in contact with the third stop (G3) of the system of reference (3), and means for maintaining the support (2) against the stops (G1, G2, G3) of the reference system (3) during mounting the electronic components on the support.

2. Apparatus in accordance with claim 1, including means for braking the displacement of the second rack (32) associated with the displacement of positioning arm (21) against the third stop (G3) of the reference system (3).

3. Apparatus as set forth in claim 2 wherein said means for braking is a leaf brake (50) arranged to favor the displacement of the first rack (31) so as to provide a delay of the pivoting of the arm (21) to assure the positioning of the support (2) against the third stop (G3) of the reference system (3).

4. Apparatus in accordance with claim 1, 2 or 3 wherein the jack (22) is a double acting jack arranged to return the two positioning arms to their initial position, and further including two stops (42, 43) arranged for limiting of the two racks (31, 32), respectively.

* * * * *